(12) United States Patent
Hasegawa et al.

(10) Patent No.: US 7,583,118 B2
(45) Date of Patent: Sep. 1, 2009

(54) DELAY LOCKED LOOP CIRCUIT

(75) Inventors: Atsushi Hasegawa, Kanagawa (JP);
Atsushi Tangoda, Kanagawa (JP)

(73) Assignee: NEC Electronics Corporation,
Kawasaki, Kanagawa (JP)

( * ) Notice: Subject to any disclaimer, the term of this patent is extended or adjusted under 35 U.S.C. 154(b) by 222 days.

(21) Appl. No.: 11/588,256

(22) Filed: Oct. 27, 2006

(65) Prior Publication Data

US 2007/0096784 A1 May 3, 2007

(30) Foreign Application Priority Data

Oct. 28, 2005 (JP) ............................. 2005-314945

(51) Int. Cl.
*H03L 7/00* (2006.01)
(52) U.S. Cl. ....................................... 327/158; 327/161
(58) Field of Classification Search ................. 327/149, 327/158, 161
See application file for complete search history.

(56) References Cited

U.S. PATENT DOCUMENTS 6,125,157 A * 9/2000 Donnelly et al. ............ 375/371
2004/0108877 A1 * 6/2004 Cho et al. .................. 327/158
2005/0110548 A1 * 5/2005 Suda et al. .................. 327/277

FOREIGN PATENT DOCUMENTS

| JP | 2001-339280 | 12/2001 |
|---|---|---|
| JP | 2004-062578 | 2/2004 |

* cited by examiner

*Primary Examiner*—Long Nguyen
(74) *Attorney, Agent, or Firm*—McGinn IP Law Group, PLLC

(57) ABSTRACT

A delay locked loop (DLL) circuit includes a first DLL section configured to receive a reference clock signal, to delay the reference clock signal in response to a first control signal, and to output a phase delayed signal having a predetermined phase delay. A second DLL section delays the reference clock signal in response to a second control signal, and generates the second control signal based on the reference clock signal delayed in the second DLL section and the phase delayed signal. An input signal delay section delays an input signal in response to the second control signal.

16 Claims, 7 Drawing Sheets

DELAY LOCKED LOOP CIRCUIT

BACKGROUND OF THE INVENTION

1. Field of the Invention

The present invention relates to a delay locked loop circuit, in which a synchronous loop is formed with delay elements.

2. Description of the Related Art

A data signal is often transferred in synchronization with a clock signal in order to surely transmit and receive the data signal between circuit blocks. In recent years, the frequency of the clock signal increases so that the circuit blocks operate at a higher speed. In order to avoid a problem of a clock skew caused due to the increase in clock frequency or a problem of measurement of a variety of transfer modes, apparatuses increase in which phase relationship of the clock signals is different between a data transmission side and a data reception side. A delay locked loop ("DLL") circuit can generate clock signals having such different phases.

For example, Japanese Laid Open Patent Application (JP-P2004-62578A) discloses a multi-phase clock generating circuit, which generates multi-phase clock signals having optional phases by use of a PLL (phase locked loop) circuit and a DLL circuit. The multi-phase clock generating circuit is composed of a multi-phase output oscillating circuit, an interpolator (a phase interpolating circuit), a first control circuit, a frequency divider, a phase shifter, a first phase comparator, a second phase comparator, and a second control circuit. The multi-phase clock generating circuit generates a feedback clock signal different in X-phase with respect to a reference clock signal. The multi-phase output oscillating circuit supplies an output clock signal to the phase interpolating circuit. The phase interpolating circuit has a mechanism of outputting a 0-phase output signal serving as a reference signal and an optional X-phase output signal which is controllably set based on a signal from an external terminal. The first control circuit has an external terminal, to which a signal can be supplied to set an optional Y-phase with respect to the reference clock signal, and outputs a control signal for setting an optional X-phase output signal with respect to a multiple clock signal to the phase interpolating circuit. Furthermore, the first control circuit outputs a phase shift count of a phase shifter and a select signal for selecting an input of phase shift data at the same time. The frequency divider frequency-divides the 0-phase output signal serving as the reference signal from the phase interpolating circuit, and has a mechanism of setting a frequency division ratio. The phase shifter receives the frequency-divided clock signals of two different phases from the frequency divider at its phase shift data inputs, and supplies the optional X-phase output clock signal outputted from the phase interpolating circuit to the phase shift clock input. Moreover, the phase shifter selects one of the shift counts with respect to the phase shift clock signal. The first phase comparator compares a phase of the reference clock signal with a phase of the frequency-divided output signal from the frequency divider, and controls an oscillation frequency of the multi-phase output oscillating circuit. The second phase comparator regards an X-phase of a signal outputted through the phase shifter as a reference of delay in the delay circuit. The second control circuit incorporates therein a delay value of a reference clock delay circuit. The multi-phase output clock generating circuit outputs a delay circuit control setting value from the second control circuit to the outside.

That is to say, the phase comparator compares the phase of the clock signal obtained by frequency dividing the clock signal from the multi-phase output oscillating circuit by the frequency divider with the phase of the reference clock signal. The multi-phase output oscillating circuit is controlled such that the above-mentioned two phases match with each other. Additionally, the phase of the-clock signal outputted from the multi-phase output oscillating circuit is interpolated by the phase interpolating circuit, so that a delay clock signal is generated to have an optional phase delay. The first phase comparator compares the phase of the clock signal obtained by delaying the reference clock signal by the delay circuit with the phase of the delayed clock signal. A delay time in the delay circuit is controlled based on the comparison result. In other words, the delay time in the delay circuit is controlled to have a predetermined delay time. A slave DLL circuit is provided, in which the delay time has been controlled by a master DLL circuit.

Otherwise, Japanese Laid Open Patent Application (JP-P2001-339280A) discloses a specific circuit configuration of a phase interpolating circuit. According to this circuit configuration, the phase interpolating circuit is constituted of a timing difference dividing circuit.

In this manner, the above-described multi-phase output clock generating circuit is provided with the multi-phase output oscillating circuit whose phase jitter influences on the delay time in the delay circuit. As a consequence, the phase jitter in the multi-phase output oscillating circuit influences on a delay time in a delay circuit on a slave side.

SUMMARY OF THE INVENTION

In an aspect of the present invention, a delay locked loop (DLL) circuit includes a first DLL section configured to receive a reference clock signal, to delay the reference clock signal in response to a first control signal, and to output a phase delayed signal having a predetermined phase delay; a second DLL section configured to delay the reference clock signal in response to a second control signal, and to generate the second control signal based on the reference clock signal delayed in the second DLL section and the phase delayed signal; and an input signal delay section configured to delay an input signal in response to the second control signal.

Here, the first DLL section may include a first delay section configured to delay the reference clock signal over a plurality of delay stages in response to the first control signal; and a first control circuit configured to generate the first control signal from the received reference clock signal and the reference clock signal delayed over the plurality of delay stages.

In this case, the reference clock signal may be single, and the first delay section may generate a differential clock signal from the single reference clock signal and delay the differential clock signal over the plurality of delay stages in response to the first control signal.

In this case, the reference clock signal may be single, and a delay amount of each of the plurality of delay stages may be set based on the first control signal in a digital form.

Also, the first delay section may output the delayed reference clock signals from some of the plurality of delay stages. The first DLL section may further include a first fixed delay circuit having a first fixed delay amount and configured to generate the phase delayed signal from some delayed reference clock signals.

Also, the second DLL section may include a second fixed delay circuit having a second fixed delay amount which is same as the first fixed delay amount and configured to delay the reference clock signal by the second fixed delay amount; a second delay section configured to delay the reference clock signal delayed by the second fixed delay amount by the second fixed delay circuit, in response to the second control signal; and a second control circuit configured to generate the second control signal from the reference clock signal delayed by the second delay section and the phase delayed signal.

In this case, the reference clock signal may be single, and the second delay section may generate a differential clock signal from the single reference clock signal and delay the differential clock signal by at least one delay stage in response to the second control signal.

Also, the reference clock signal may be single, and a delay amount of the at least one delay stage may be set based on the second control signal in a digital form.

Also, the first delay section may output the delayed reference clock signal from one of the plurality of delay stages as the phase delayed signal.

In this case, the second DLL section may include a second delay section configured to delay the reference clock signal in response to the first and second control signals; a third fixed delay circuit having a third fixed delay amount which is predetermined and configured to delay the reference clock signal delayed by the second delay section by the second fixed delay amount; and a second control circuit configured to generate the second control signal from the reference clock signal delayed by the second delay section and the phase delayed signal.

In this case, the reference clock signal may be single, and the second delay section may generate a differential clock signal from the single reference clock signal and delay the differential clock signal by at least one delay stage in response to the first control signal.

Also, the reference clock signal may be single, and a delay amount of the at least one delay stage may be set based on the second control signal in a digital form.

Also, the input signal delay section may include a third delay section configured to delay an input signal in response to the second control signal.

Also, the input signal may be single, and the third delay section may generate a differential input signal from the single input signal, delay the differential input signal by at least one delay stage in response to the second control signal, and generate a delayed single input signal from the delayed differential input signal.

Also, the input signal may be single, and the third delay section may generate a differential input signal from the single input signal.

Also, the input signal delay section may include a third delay section configured to delay an input signal over a plurality of delay stages in response to the first and second control signal, and to output delayed input signals from some of the plurality of delay stages; and a fourth fixed delay circuit having a fourth fixed delay amount which is predetermined and configured to generate an output signal from the delayed input signals.

Here, the plurality of delay stages may have different delay amounts.

DESCRIPTION OF THE PREFERRED EMBODIMENTS

Hereinafter, a delay locked loop (DLL) circuit of the present invention will be described in detail with reference to the attached drawings.

First Embodiment

Figure 1:
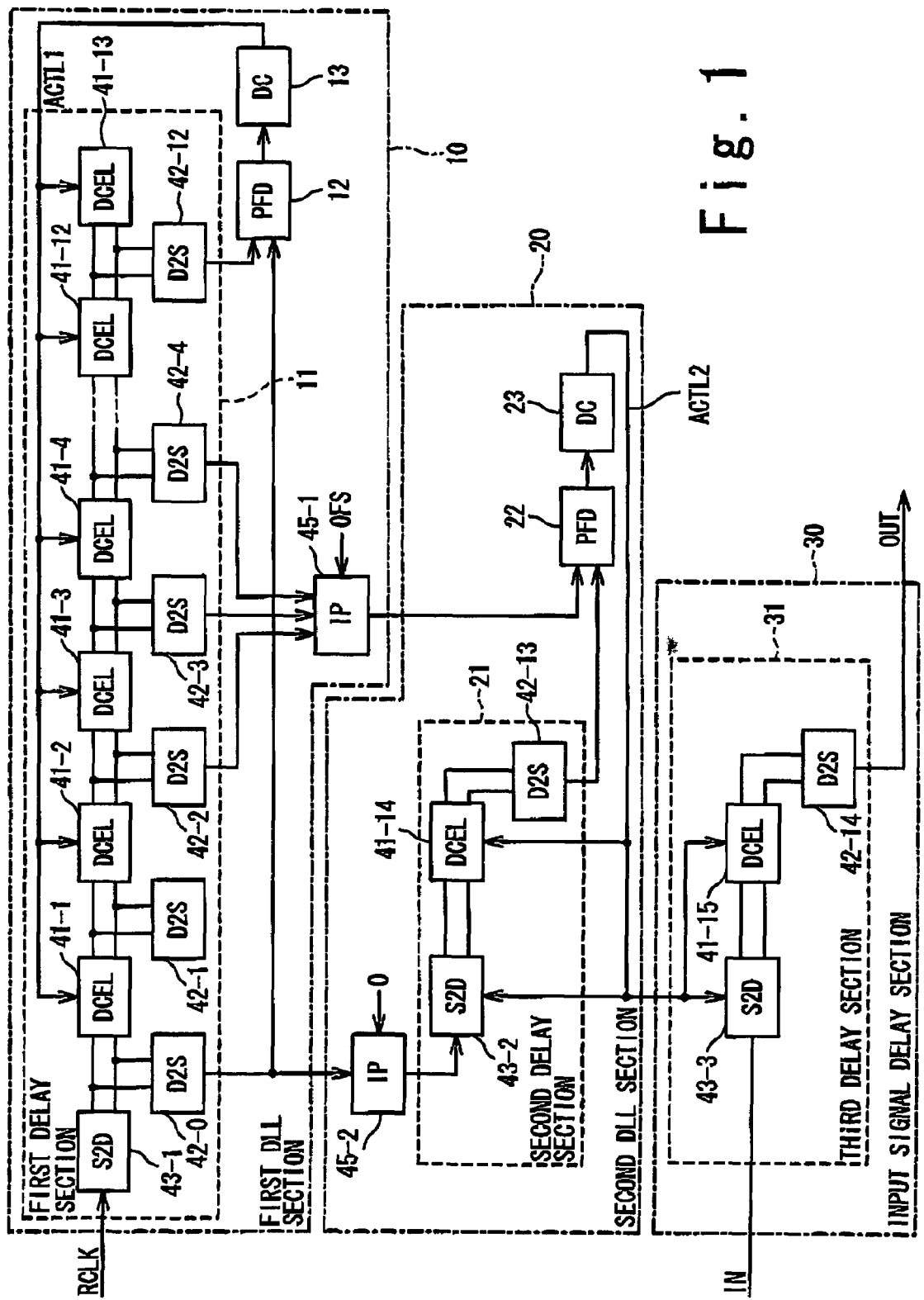
FIG. 1 is a block diagram showing the configuration of a delay locked loop (DLL) circuit according to a first embodiment of the present invention.

FIG. 1 is a block diagram showing the configuration of the delay locked loop (DLL) circuit according to the first embodiment of the present invention. Referring to FIG. 1, the delay locked loop circuit is provided with a first delay locked loop section 10, a second delay locked loop section 20 and an input signal delay section 30. The first delay locked loop section 10 receives a reference clock RCLK, and generates a phase delayed signal having a predetermined phase delay in synchronization with the reference clock RCLK. The second delay locked loop section 20 receives the phase delayed signal and a 0-phase signal, and generates a delay control signal ACTL2 corresponding to a delay between the 0-phase signal and the phase delayed signal. The input signal delay section 30 receives an input signal IN and the delay control signal ACTL2, and outputs a resultant output signal OUT by delaying the input signal IN by a delay defined in the delay control signal ACTL2.

The first delay locked loop section 10 includes a first delay section 11, a phase comparing circuit (PFD) 12, a delay control circuit (DC) 13 and a phase interpolating circuit (IP) 45-1. The first delay section 11 has delay circuits (DCELs) 41-1 to 41-13, differential signal/single signal converting circuits (D2Ss) 42-0 to 42-12 and a single signal/differential signal converting circuit (S2D) 43-1. Here, the first delay section 11 generates a delay in response to a differential signal.

The reference clock RCLK is supplied to the first delay section 11, is converted into a differential signal by the single signal/differential signal converting circuit 43-1, and is then supplied to the delay circuit 41-1 and the differential signal/single signal converting circuit 42-0. The delay circuits 41-1 to 41-13 are cascade-connected to delay the differential signal. The differential signal outputted from each of the delay circuits 41-1 to 41-12 is converted into a single end signal by each of the differential signal/single signal converting circuits 42-1 to 42-12. A signal outputted from the single signal/differential signal converting circuit 43-1 is converted into a single end signal by the differential signal/single signal converting circuit 42-0, and the single end signal is then supplied into the phase comparing circuit 12 and the second delay locked loop section 20.

The phase comparing circuit 12 receives as another input signal to be compared, a signal obtained by converting an output signal from the delay circuit 41-12 at a twelfth stage into the single end signal by the differential signal/single signal converting circuit 42-12. Therefore, the phase comparing circuit 12 compares the phase of the output signal from the twelfth stage with the phase of the 0-phase input signal. As a consequence, the phase comparing circuit 12 outputs a comparison result to the delay control circuit 13. The delay control circuit 13 includes a charge pump, a filter and a voltage/current converting circuit. The delay control circuit 13 generates a delay control signal ACTL1 and controls the delay circuits 41-1 to 41-13 to make the phases of the two input signals to the phase comparing circuit 12 to align with each other. Through this feedback control, the first delay section 11 can correctly produce a delay of 360 degrees. The delay circuit 41-13 is a terminal circuit for compensating the continuity of the circuits.

Here, the delay circuits 41 (41-1 to 41-12) in the twelve stages produce a delay of 360 degrees. That is, the delay circuit 41 at one stage generates a phase delay of 30 degrees. In other words, an amount of a phase delay depends on the number of stages of the delay circuits 41 included in the first delay section 11. Since explanation is made on a desired target delay of the input signal IN which should range from 60 degrees to 120 degrees, outputs from the delay circuits 41-2, 41-3 and 41-4 are converted into single end signals by the differential signal/single signal converting circuits 42-2, 42-3 and 42-4, respectively, and are supplied into the phase interpolating circuit 45-1. Positions of the first delay section 11 from which phase signals are taken out, are varied according to the range of the target delay. The phase interpolating circuit 45-1 has a total delay as a summation of a fixed phase delay inherent to the circuit and a phase delay set based on an interpolation control signal OFS. The phase interpolating circuit 45-1 applies the total delay to the signals received from the circuits 42-2, 42-3 and 42-4 to generate an output signal, which is supplied into the second delay locked loop section 20.

The second delay locked loop section 20 includes a second delay section 21, a phase comparing circuit 22, a delay control circuit 23 and a phase interpolating circuit 45-2. The signal outputted from the phase interpolating circuit 45-1 included in the first delay locked loop section 10 is supplied into the phase comparing circuit 22 included in the second delay locked loop section 20. In the meantime, the phase interpolating circuit 45-2 receives a single end signal of 0 phase converted by the differential signal/single signal converting circuit 42-0 included in the first delay locked loop section 10, and an interpolation control signal 0. Thus, the phase interpolating circuit 45-2 outputs the 0-phase signal. That is to say, the phase interpolating circuit 45-2 serves as a fixed delay circuit for giving a fixed delay inherent to the phase interpolating circuit 45-1, which is not varied in response to the interpolating control signal 0. Thus, the phase interpolating circuit 45-2 outputs a signal delayed by the fixed delay to the second delay section 21.

The second delay section 21 has a single signal/differential signal converting circuit 43-2, a delay circuit 41-14 and a differential signal/single signal converting circuit 42-13. The single end signal outputted from the phase interpolating circuit 45-2 is converted into a differential signal by the single signal/differential signal converting circuit 43-2, and is then supplied into the delay circuit 41-14. Delay amounts of the single signal/differential signal converting circuit 43-2 and the delay circuit 41-14 are controlled in response to the delay control signal ACTL2. The delay circuit 41-14 outputs a signal with a controlled delay to the phase comparing circuit 22 via the differential signal/single signal converting circuit 42-13. The phase comparing circuit 22 receives the signal delayed by the second delay section 21 and the signal having the delay amount set by the first delay locked loop section 10. The phase comparing circuit 22 compares the phases of the two input signals with each other, and outputs the comparison result to the delay control circuit 23. The delay control circuit 23 includes a charge pump, a filter and a voltage/current converting circuit. The delay control circuit 23 generates the delay control signal ACTL2 in such a manner as to allow the phases of the two input signals into the phase comparing circuit 22 to match with each other. The delay control circuit 23 outputs the delay control signal ACTL2 into the single signal/differential signal converting circuit 43-2 and the delay circuit 41-14, to control their delay amounts. Through this feedback control, the second delay section 21 can correctly have a delay difference between the two signals outputted from the first delay locked loop section 10, that is, a delay amount corresponding to a phase difference between the 0-phase signal and the signal having the set target phase. The delay control signal ACTL2 corresponding to the delay amount is outputted into the input signal delay section 30.

The input signal delay section 30 includes a third delay section 31, which has a single signal/differential signal converting circuit 43-3, a delay circuit 41-15 and a differential signal/single signal converting circuit 42-14. Specifically, the third delay section 31 is configured to have the same configuration as the second delay section 21 included in the second delay locked loop section 20. In addition, delay amounts of the single signal/differential signal converting circuit 43-3 and the delay circuit 41-15 are controlled in response to the delay control signal ACTL2. As a consequence, a delay amount of the third delay section 31 becomes equal to that of the second delay section 21. Namely, the input signal delay section 30 outputs the output signal OUT obtained by delaying the input signal IN by the delay amount produced by the second delay locked loop section 20. It should be noted that the single signal/differential signal converting circuit 43-2 and the delay circuit 41-14, and the single signal/differential signal converting circuit 43-3 and the delay circuit 41-15 are delay-controlled in response to the delay control signal ACTL2 in the above-described embodiment. However, only the single signal/differential signal converting circuit 43-2 and the single signal/differential signal converting circuit 43-3 or only the delay circuit 41-14 and the delay circuit 41-15 may be delay-controlled.

Figure 4:
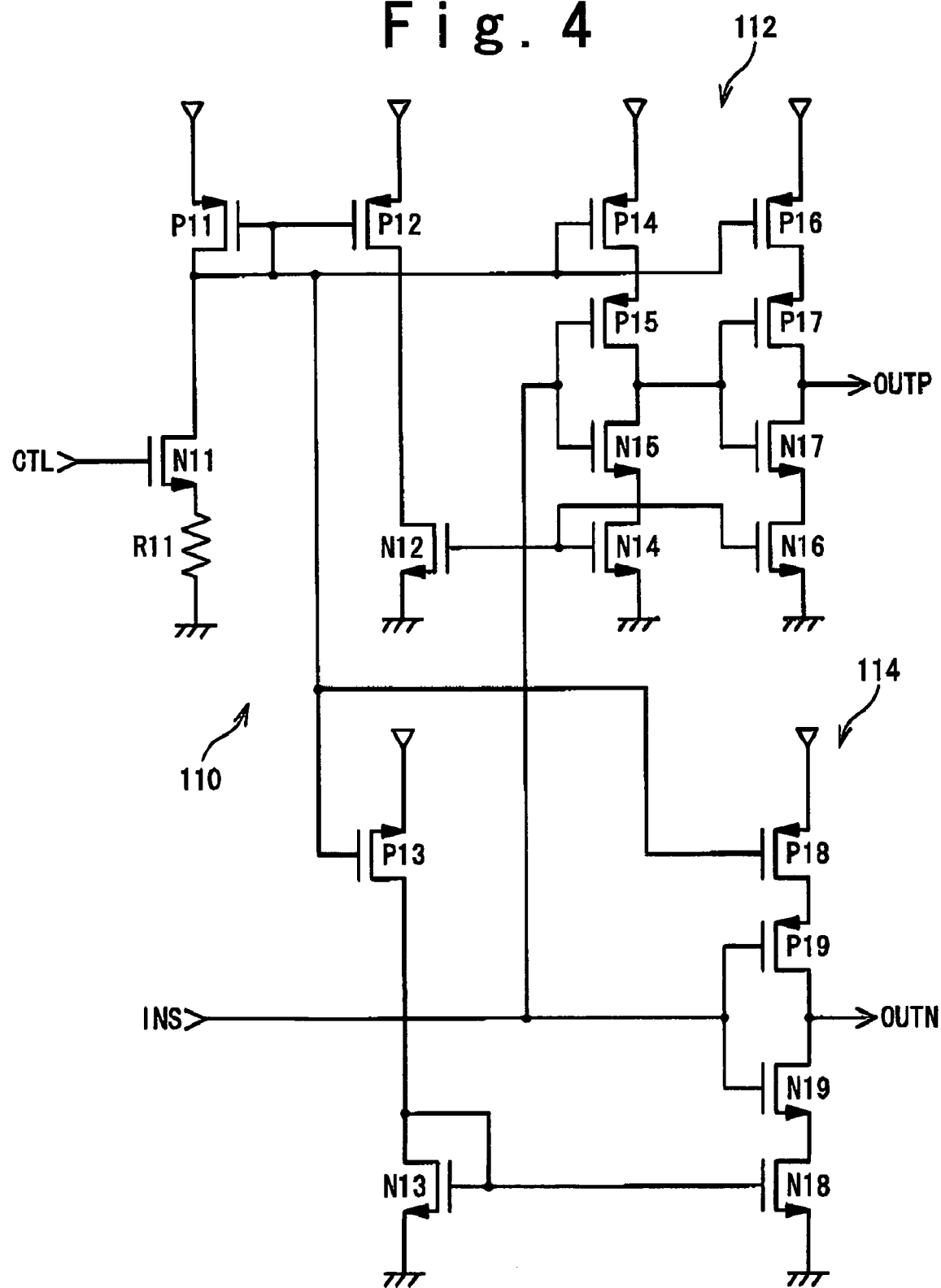
FIG. 4 is a circuit diagram showing a specific example of a single signal/differential signal converting circuit in the embodiments of the present invention.

Next, a specific example of the single signal/differential signal converting circuit 43 (43-1 to 43-3) will be described. FIG. 4 is a circuit diagram showing the specific example of the single signal/differential signal converting circuit 43. The single signal/differential signal converting circuit 43 receives a single end signal INS, and outputs a differential output signal OUTP/OUTN. A delay amount is controlled in response to a control signal CTL. The single signal/differential signal converting circuit 43 is provided with a voltage/current converting circuit section 110, a buffer circuit section 112 and an inverter circuit section 114. The buffer circuit section 112 includes transistors P14 to P17 and N14 to N17. A current flowing through a buffer circuit consisting of the transistors P15, N15, P17 and N17 is controlled by the transistors P14, N14, P16 and N16, so that a delay amount of the output signal OUTP with respect to the input signal INS is controlled. The inverter circuit section 114 includes transistors P18, P19, N18 and N19. A current flowing through an inverter circuit consisting of the transistors P19 and N19 is controlled by the transistors P18 and N18, so that a delay amount of the output signal OUTN with respect to the input signal INS is controlled. The voltage/current converting circuit section 110 includes transistors P11 to P13 and N11 to N13 and a resistor element R11. The voltage/current converting circuit section 110 constitutes a current mirror circuit, in which a current flow is controlled based on a voltage of the control signal CTL to be applied to a gate of the transistor N11. The buffer circuit section 112 and the inverter circuit section 114 are different from each other in number of stages of the transistors, through which the signals pass. Therefore, a current value is adjusted such that the delay amounts of the buffer circuit section 112 and the inverter circuit section 114 are equal to each other by varying a size ratio of the transistor P12 to the transistor N12 or of the transistor P13 to the transistor N13. When delay control is not needed like in the single signal/differential signal converting circuit 43-1, a proper fixed voltage is applied to the control voltage CTL.

Figure 5:
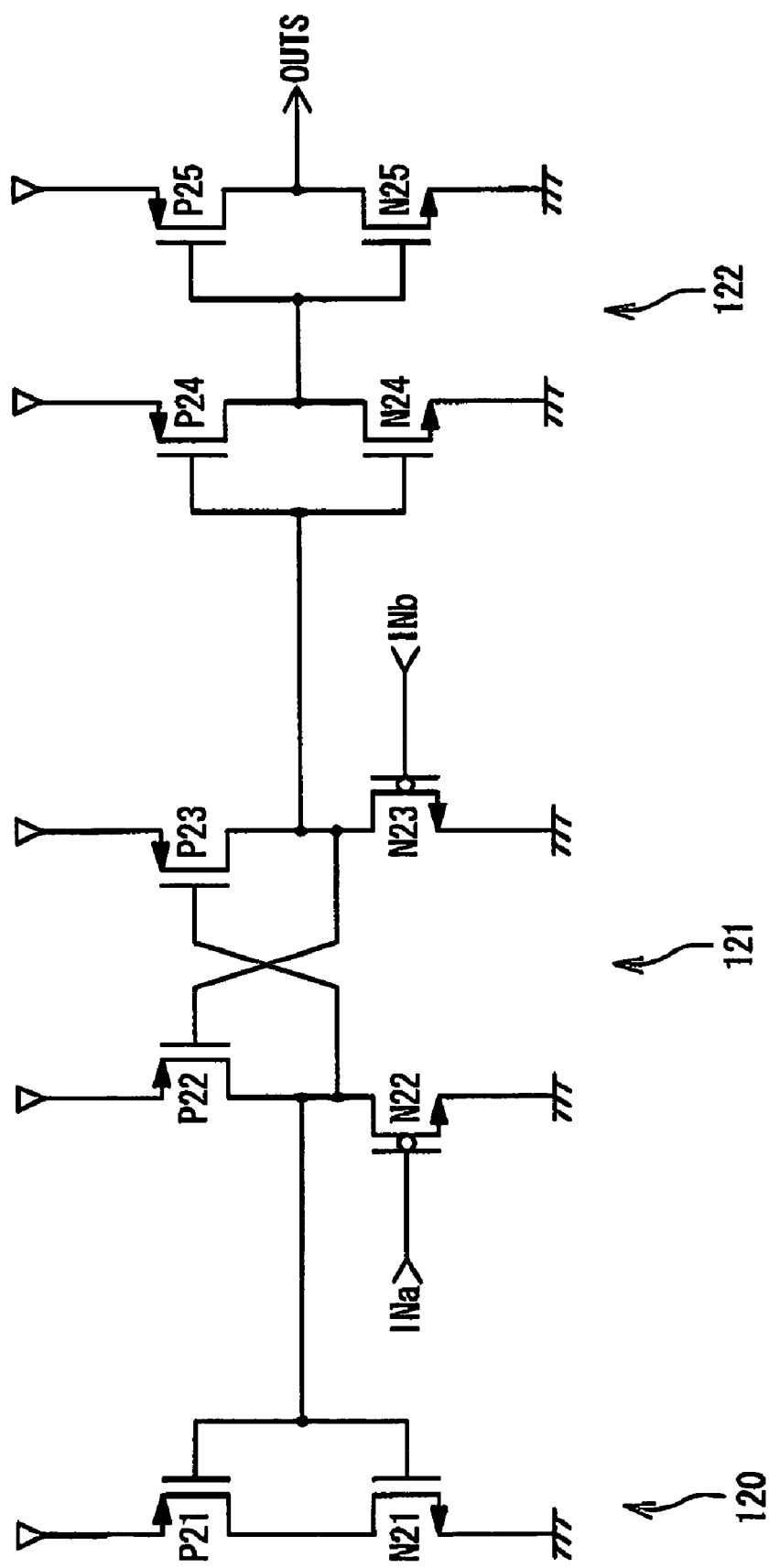
FIG. 5 is a circuit diagram showing a specific example of the single signal/differential signal converting circuit in the embodiments of the present invention.

As illustrated in FIG. 5, the differential signal/single signal converting circuit 42 is provided with an inverter circuit section 120, a differential signal input section 121 and a buffer circuit section 122. The differential signal input section 121 includes transistors P22, P23, N22 and N23. Differential input signals INa/INb are applied to gates of the depletion type transistors N22 and N23, respectively. A signal having the same phase as that of the input signal INa is outputted from a connection node between the transistor P23 and the transistor N23, and is then supplied to the buffer circuit section 122. The buffer circuit section 122 is a buffer circuit including an inverter circuit consisting of transistors P24 and N24 and an inverter circuit consisting of transistors P25 and N25, which are connected in series on two stages. Therefore, the differential signal INa/INb supplied into the differential single input unit 121 is output as a single end signal OUTS. The inverter circuit section 120 provided with transistors P21 and N21 is a dummy circuit, which is adapted to hold the symmetry of the circuits and compensates characteristics.

Figure 6:
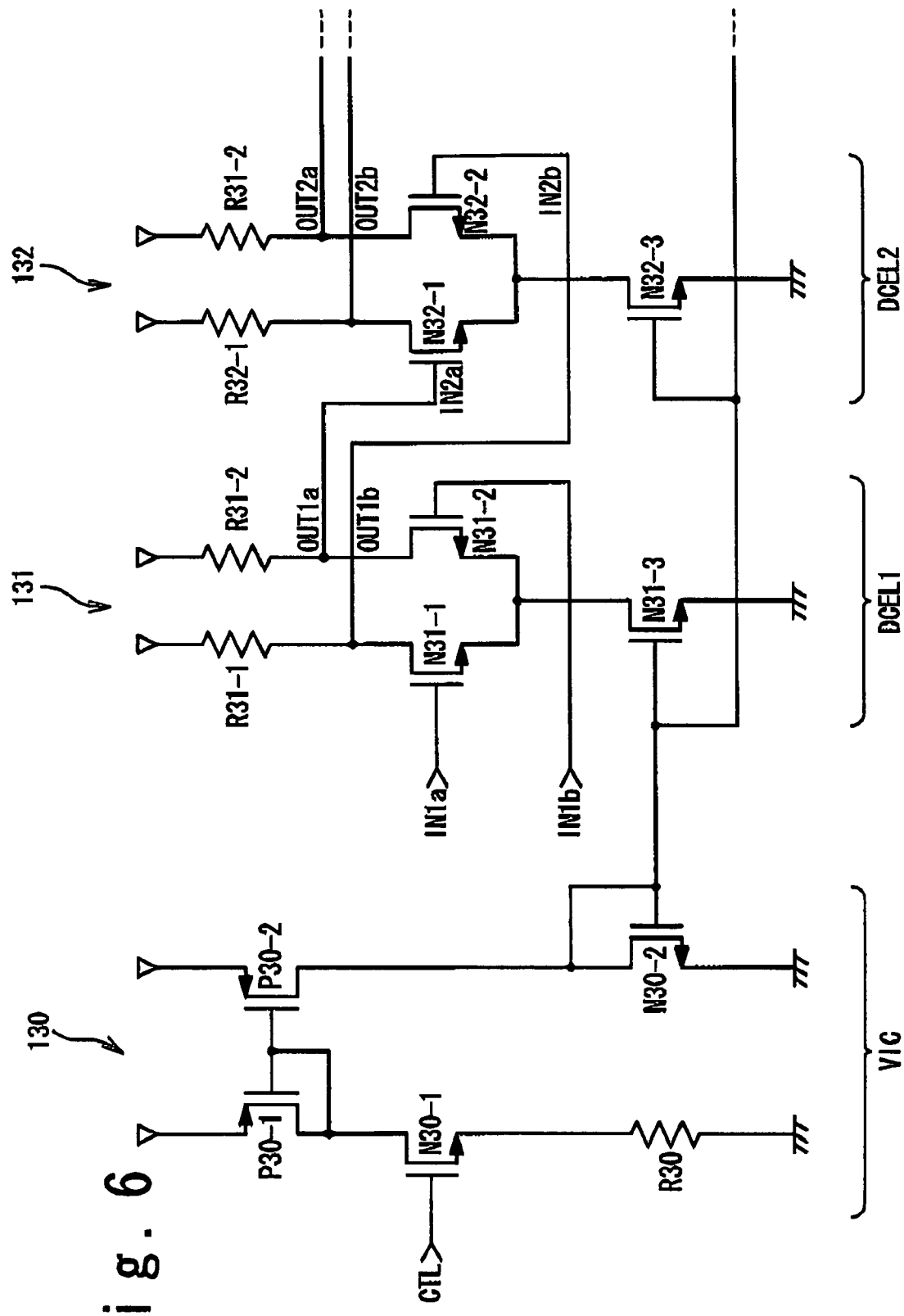
FIG. 6 is a circuit diagram showing specific examples of a voltage/current converting circuit and a delay circuit in the embodiment of the present invention.

FIG. 6 illustrates an example of a voltage/current converting circuit (VIC) and delay circuits (DCELs). A voltage/current converting circuit 130 includes transistors P30-1, P30-2, N30-1 and N30-2 and a resistor element R30. A delay circuit 131 includes transistors N31-1, N31-2 and N31-3 and resistor elements R31-1 and R31-2. Another delay circuit 132 includes transistors N32-1, N32-2 and N32-3 and resistor elements R32-1 and R32-2. In other words, a delay circuit 13n (where n=1, 2, . . . ) includes transistors N3n-1, N3n-2 and N3n-3 and resistor elements R3n-1 and R3n-2, and the delay circuits are cascade-connected for the required number of stages.

A control voltage input signal CTL is applied to a gate of the transistor N30-1, to control a drain current. The transistors P30-1 and P30-2 constitute a current mirror circuit, in which a current corresponding to the drain current flowing through the transistor N30-1 flows through the transistor P30-2. Current mirror circuits of multiple stages, in which the drain current flowing through the transistor N30-2 is regarded as a reference current, are configured between the transistor N30-2 and the respective transistors N31-3, N32-3, . . . of the delay circuits 131, 132, . . . That is to say, a gate voltage in the transistor N30-2 is supplied as respective gate voltages in the transistors N31-3, N32-3, . . . , to control the drain current in each of the transistors.

The delay circuit 13n is a differential amplifying circuit, in which the current is controlled by the transistor N3n-3. A differential signal input INna/INnb is applied to gates of the transistors N3n-1 and N3n-2, respectively. The resistor elements R3n-1 and R3n-2 are load resistors. A differential signal output OUTna/OUTnb in the delay circuit 13n is outputted from a connection node between the load resistor R3n-1 and the transistor N3n-1 and a connection node between the load resistor R3n-2 and the transistor N3n-2, respectively. All of the transistors N31-3 to N3n-3 are controlled at the same gate voltage, so that the delay circuits 131 to 13n have the same delay.

A delay produced in the delay locked loop circuit having the above configuration will be described below. The output signal from the single signal/differential signal converting circuit 43-1 is set to the phase of 0, and the delay of each of the circuits is designated by "D (circuit symbol)". That is to say, the delay amount of the delay circuit 41 is denoted by D(DCEL); the delay of the differential signal/single signal converting circuit 42 is designated by D(D2S); the delay amount of the single signal/differential signal converting circuit 43 is denoted by D(S2D); and the delay amount of the phase interpolating circuit 45 is designated by D(IP). The delay at an output point of the delay circuit 41-12 is denoted by 12D(DCEL). Since this delay amount is controlled to be equal to one period of the reference clock signal RCLK, 12D(DCEL)=360 degrees: namely, D(DCEL)=30 degrees.

A delay at the output of the delay circuit 41-1 is D(DCEL)=30 degrees; a delay at the output of the delay circuit 41-2 is 2D(DCEL)=60 degrees; a delay at the output of the delay circuit 41-3 is 3D(DCEL)=90 degrees; and a delay at the output of the delay circuit 41-4 is 4D(DCEL)=120 degrees. Consequently, a delay at the output of the phase interpolating circuit 45-1 falls within a range from D(IP)+D(D2S)+2D(DCEL) to D(IP)+D(D2S)+4D(DCEL). Therefore, assuming that α is a delay amount interpolated by the phase interpolating circuit 45-1, 2D(DCEL)≦α≦4D(DCEL). The delay at the output of the phase interpolating circuit 45-1 is D (IP)+D (D2S)+2D(DCEL)+α. A signal having this delay amount of D(IP)+D(D2S)+2D(DCEL)+α is supplied into the phase comparing circuit 22 in the second delay locked loop section 20.

On the other hand, the 0-phase signal is supplied to the second delay locked loop section 20 via the differential signal/single signal converting circuit 42-0. That is to say, the delay at this point is D(D2S). This signal is supplied into the phase comparing circuit 22 via the phase interpolating circuit 45-2, the single signal/differential signal converting circuit 43-2, the delay circuit 41-14 and the differential signal/single signal converting circuit 42-13. Therefore, a delay on an input side of the phase comparing circuit 22 is expressed as:

D(D2S)+D(IP)+D(S2D, DCEL)+D(D2S)

Here, the delay amount D(S2D, DCEL) is a delay amount obtained by adjusting the single signal/differential signal converting circuit 43-2 and the delay circuit 41-14 under the control of the delay control signal ACTL2. The phase comparing circuit 22 compares the respective phases of these two signals, and the delay control circuit 23 generates the delay control signal ACTL2 to eliminate a difference in phase. As a result, the delay amounts of these two signals become equal to each other. Specifically,

D(IP)+D(D2S)+2D(DCEL)+α=D(D2S)+D(IP)+D(S2D, DCEL)+D(D2S)

In summary,

2D(DCEL)+α=D(D2S)+D(S2D, DCEL)    (1)

In the input signal delay section 30, the input signal IN is outputted as the output signal OUT through the single signal/differential signal converting circuit 43-3, the delay circuit 41-15 and the differential signal/single signal converting circuit 42-14. As a consequence, a delay of the output signal OUT with respect to the input signal IN is expressed as D(S2D, DCEL)+D(D2S).

It is found from the above expression (1) that the delay is 2D(DCEL)+α. In other words, the delay amount of the output signal OUT with respect to the input signal IN is equal to the target delay amount set in the phase interpolating circuit 45-1. In this manner, no oscillating circuit is provided in the delay locked loop circuit in the present embodiment. Thus, a delay signal with little phase jitter can be produced. Furthermore, it is possible to provide the circuit with a small phase error, as described above.

If the delay locked loop circuit is provided with a plurality of input signal delay sections 30 to receive a plurality of input signals IN, output signals OUT delayed by the same delay amount can be outputted. In this way, the output signal OUT having an optional phase can be obtained without providing any phase interpolating circuit in the input signal delay section 30. In contrast, in order to obtain a plurality of signals having different phase delays, there may be provided with a group including the phase interpolating circuit 45-1 having such phase delays in the first delay locked loop section 10 and the second delay locked loop section 20, and the input signal delay section 30 whose delay is controlled in response to the delay control signal ACTL2 is provided in the second delay locked loop section 20.

Second Embodiment

Figure 2:
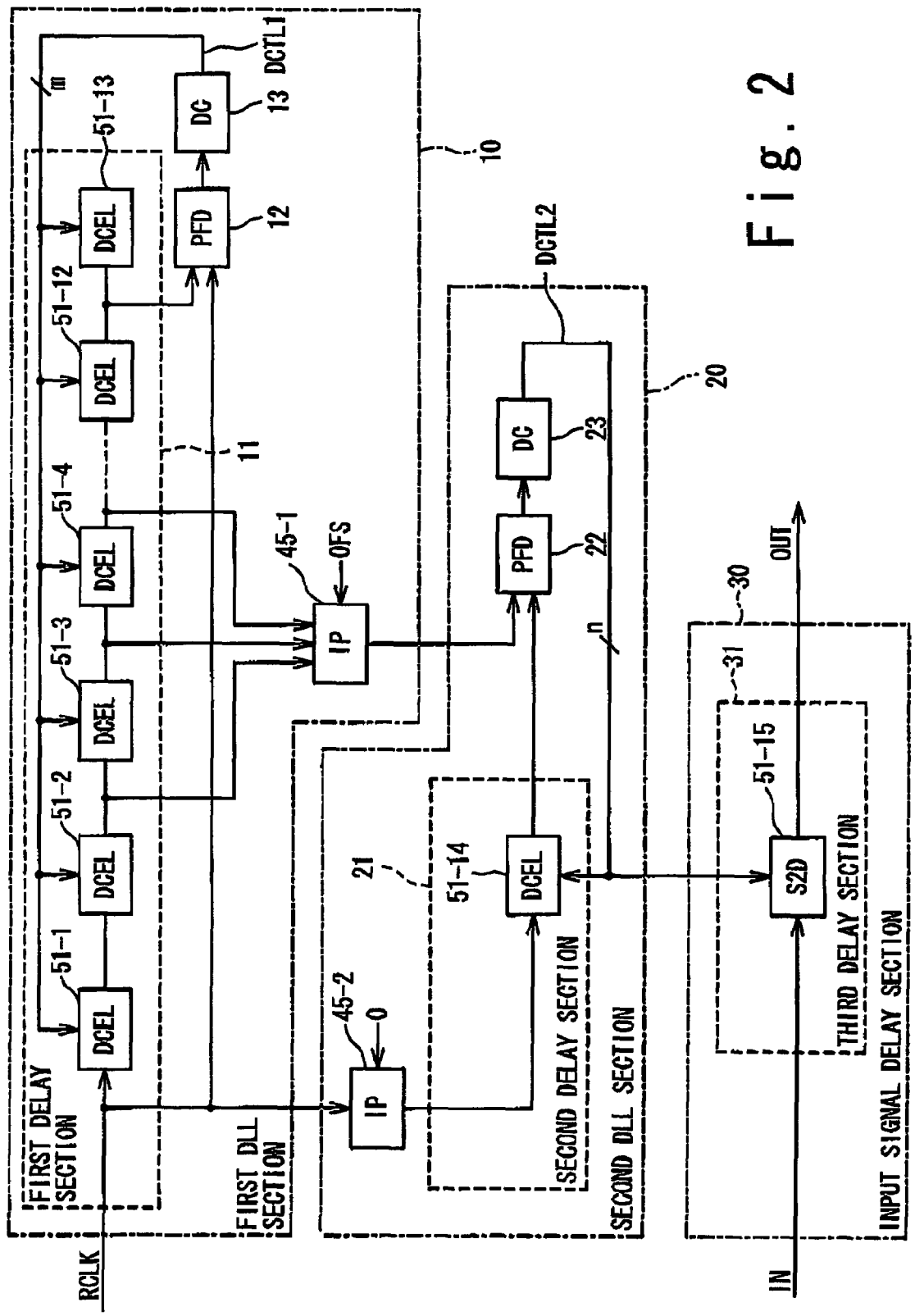
FIG. 2 is a block diagram showing the configuration of the delay locked loop circuit according to a second embodiment of the present invention.

As described above, although the first delay section 11 applies a delay to the differential signal, the delay may be applied to the single end signal. In the second embodiment, a delay is generated by a digital control delay circuit for delaying the single end signal. A delay locked loop circuit in the second embodiment will be described below with reference to FIG. 2. The basic configuration of the delay locked loop circuit is a same as that of the delay locked loop circuit illustrated in FIG. 1. As shown in FIG. 2, the delay locked loop circuit is provided with a first delay locked loop section 10, a second delay locked loop section 20 and an input signal delay section 30. The first delay locked loop section 10 receives a reference clock signal RCLK, and generates a phase delayed signal having a predetermined phase delay in synchronism with the reference clock signal RCLK. The second delay locked loop section 20 receives the phase delayed signal and the 0-phase signal, and generates a delay control signal DCTL2 corresponding to a delay amount between the 0-phase signal and the phase delayed signal. The input signal delay section 30 receives an input signal IN and the delay control signal DCTL2, and applies the delay expressed in the delay control signal DCTL2 to the input signal IN, to output a resultant output signal OUT.

The first delay locked loop section 10 includes the first delay section 11, the phase comparing circuit (PFD) 12, the delay control circuit (DC) 13 and the phase interpolating circuit (IP) 45-1. The first delay section 11 has digital control delay circuits (DCELs) 51-1 to 51-13. Here, the first delay section 11 generates a delay from the single end signal. The reference clock signal RCLK is received by the first delay section 11 and the phase comparing circuit 12, and is supplied to the second delay locked loop section 20. In the first delay section 11, the digital control delay circuits 51-1 to 51-13 are cascade-connected, to delay the input reference clock signal RCLK. The phase comparing circuit 12 receives a signal outputted from the digital control delay circuit 51-12 and the reference clock signal RCLK, and compares their phases. The phase comparing circuit 12 outputs a comparison result to the delay control circuit 13. The delay control circuit 13 includes a counter and the like, and converts the phase delay into a digital value. The delay control circuit 13 generates a delay control signal DCTL1 and controls the digital control delay circuits 51-1 to 51-13 such that phases of the input signals into the phase comparing circuit 12 align with each other. The delay control signal DCTL1 is of m bits. Through this feedback control, the first delay section 11 can correctly produce the delay of 360 degrees. Consequently, each digital control delay circuit 51 (51-1 to 51-12) generates the phase delay of 30 degrees. The digital control delay circuit 51-13 is a terminate circuit for compensating the continuity of the circuits. Output signals from the digital control delay circuits 51-1 to 51-12 are supplied into the phase interpolating circuit 45-1, to produce a target delay amount. Here, assuming that the target delay amount is set to an optional delay amount (60 degrees +α) within a range from 60 degrees to 120 degrees, the each output signal from the digital control delay circuits 51-2, 51-3 and 51-4 is supplied into the phase interpolating circuit 45-1. Positions in the first delay section 11, from which phase signals are taken out are varied according to the range of the target delay. The phase interpolating circuit 45-1 has a total delay as a summation of a fixed delay inherent to the circuit and a phase delay set in response to an interpolation control signal OFS. A signal delayed by the phase interpolating circuit 45-1 is supplied into the second delay locked loop section 20.

The second delay locked loop section 20 includes a second delay section 21, a phase comparing circuit 22, a delay control circuit 23 and a phase interpolating circuit 45-2. The signal outputted from the phase interpolating circuit 45-1 is supplied into the phase comparing circuit 22 of the second delay locked loop section 20. Also, the phase interpolating circuit 45-2 receives the reference clock signal RCLK. The phase interpolating circuit 45-2 is set in response to a phase interpolating control signal of 0 to output the 0-phase signal. Specifically, the phase interpolating circuit 45-2 generates a fixed delay, which is independent from the phase interpolating control signal and is inherent to the phase interpolating circuit 45. Thus, the phase interpolating circuit 45-2 outputs a signal delayed by the fixed delay to the second delay section 21. The second delay section 21 has a digital control delay circuit 51-14. The digital control delay circuit 51-14 applies a delay controlled in response to the delay control signal DCTL2 to a signal outputted from the phase interpolating circuit 45-2, and outputs the controlled delay to the phase comparing circuit 22. The phase comparing circuit 22 compares the phase of the signal delayed by the second delay section 21 and the phase of the signal having the delay amount set by the first delay locked loop section 10, and outputs the comparison result to the delay control circuit 23. The delay control circuit 23 includes a charge pump, a filter and the like. The delay control circuit 23 generates the delay control signal DCTL2 such that the phases of the two input signals into the phase comparing circuit 22 match with each other, and outputs a comparison resultant signal to the digital control delay circuit 51-14. The delay control signal DCTL2 is assumed to be of n bits. A delay amount of the digital control delay circuit 51-14 is controlled in response to the delay control signal DCTL2. Through this feedback control, the second delay section 21 can correctly have a delay difference between the two signals outputted from the first delay locked loop section 10, that is, a delay amount corresponding to the phase difference between the 0-phase signal and the signal having the set target phase. The delay control signal DCTL2 corresponding to the delay amount is outputted to the input signal delay section 30.

The input signal delay section 30 is provided with a third delay section 31 including a digital control delay circuit 51-15. The third delay section 31 has a same configuration as the second delay section 21 in the second delay locked loop section 20. In addition, a delay amount of the digital control delay circuit 51-15 is controlled in response to the delay control signal DCTL2. As a consequence, a delay amount of the third delay section 31 is equal to that of the second delay section 21. Namely, the input signal delay section 30 outputs an output signal OUT by delaying the input signal IN by a delay amount produced by the second delay locked loop section 20.

Figure 7:
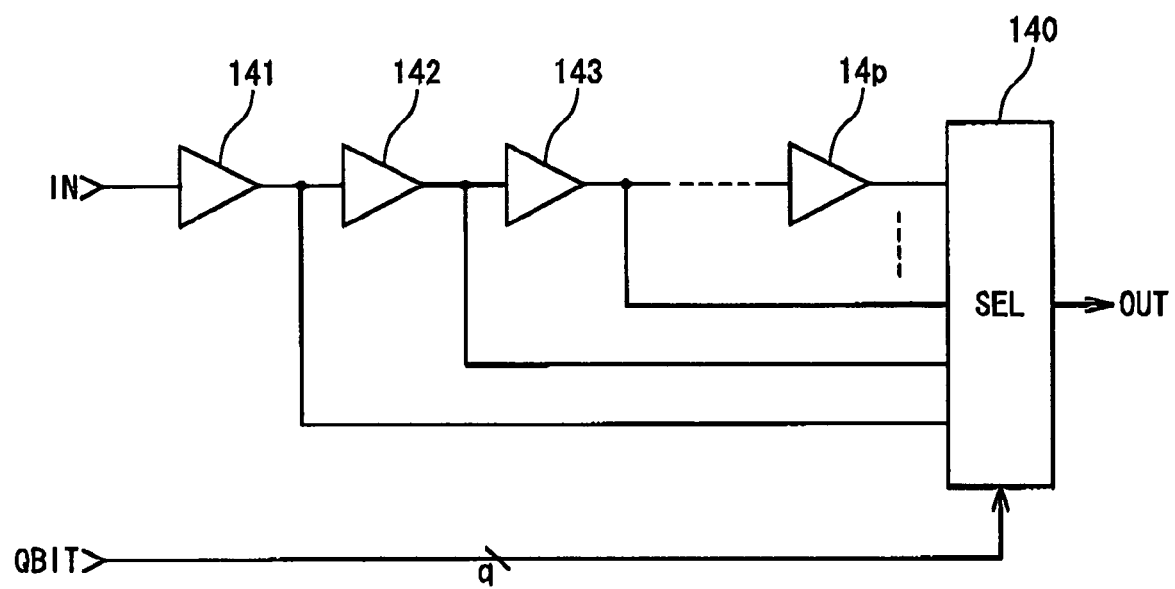
FIG. 7 is a circuit diagram showing a specific example of a digital control delay circuit in the embodiment according to the present invention.

Here, a specific example of the digital control delay circuits 51-1 to 51-15 is shown specifically. FIG. 7 is a circuit diagram showing a specific example of the digital control delay circuit 51 (51-1 to 51-15). The digital control delay circuit 51 includes buffer circuits 141, 142, ... and 14p and a selector 140. The buffer circuits 141, 142, ... and 14p are cascade-connected, and their outputs are supplied into the selector 140. The selector 140 selects one of the output signals of the buffer circuits in response a control signal QBIT and outputs the selected signal as the output signal OUT. Consequently, if the control signal QBIT is of q bits, 2q buffer circuits 14 are cascade-connected.

The delay in the second embodiment using the digital control delay circuit 51 is basically equal to that in the first embodiment. Therefore, its detailed description will be omitted here. The output signal OUT is a signal delayed by a target delay amount 2D(DCEL)+α with respect to the input signal IN.

Third Embodiment

Next, a delay locked loop circuit according to the third embodiment of the present invention will be described below with reference to FIG. 3. The delay locked loop circuit is provided with a first delay locked loop section 60, a second delay locked loop section 70 and an input signal delay section 80. The first delay locked loop section 60 receives the reference clock signal RCLK, and generates a phase delayed signal of a predetermined phase delay in synchronism with the reference clock signal RCLK. The second delay locked loop section 70 receives the phase delayed signal and the 0-phase signal, and generates the delay control signal ACTL2 corresponding to the delay amount between the 0-phase signal and the phase delayed signal. The input signal delay section 80 receives the input signal IN and the delay control signal ACTL2, and applies a delay expressed in the delay control signal ACTL2 and an optional delay to the input signal IN, to output as the output signal OUT. The optional delay is also controlled to be a predetermined amount with respect to the reference clock signal RCLK.

The first delay locked loop section 60 includes the first delay section 61, a phase comparing circuit (PFD) 12 and the delay control circuit (DC) 13. The first delay section 61 has delay circuits (DCELs) 41-1 to 41-13, the differential signal/single signal converting circuits (D2Ss) 42-0 to 42-12 and the single signal/differential signal converting circuit (S2D) 43-1. The reference clock signal RCLK supplied into the first delay section 61 is converted into a differential signal by the single signal/differential signal converting circuit 43-1, and is supplied to the delay circuit 41-1 and the differential signal/single signal converting circuit 42-0. The delay circuits 41-1 to 41-13 are cascade-connected, to delay the differential signal. The differential signals outputted from the delay circuits 41-1 to 41-12 are converted into single end signals by the differential signal/single signal converting circuits 42-1 to 42-12, respectively. A signal outputted from the single signal/differential signal converting circuit 43-1 is converted into a single end signal by the differential signal/single signal converting circuit 42-0, and the single end signal is supplied into the phase comparing circuit 12 and the second delay locked loop section 70.

The phase comparing circuit 12 receives, as another input signal to be compared, a signal obtained by converting an output signal from the delay circuit 41-12 on a twelfth stage into a single end signal by the differential signal/single signal converting circuit 42-12. Therefore, the phase comparing circuit 12 compares the phase of the output signal on the twelfth stage with the phase of the 0-phase input signal. As a consequence, the phase comparing circuit 12 outputs a comparison result to the delay control circuit 13. The delay control circuit 13 includes a charge pump, a filter and a voltage/current converting circuit, and generates the delay control signal ACTL1 and controls the delay circuits 41-1 to 41-13 such that the phases of the two input signals to the phase comparing circuit 12 match with each other. Through this feedback control, the first delay section 61 can correctly produce a delay of 360 degrees. The delay circuit 41-13 is a termination circuit for compensating the continuity of the circuits. Here, the delay circuits 41 on the twelve stages produce the delay of 360 degrees, namely, the delay circuit 41 generates the phase delay of 30 degrees per a stage in the same manner as in the first embodiment. Since a desired target delay of the input signal IN is in a range from 60 degrees to 120 degrees in the present embodiment, an output signal from the delay circuit 41-2 is supplied to the second delay locked loop section 70 via the differential signal/single signal converting circuit 42-3. A position of the first delay section 61, from which a phase signal is taken out is varied according to the range of the target delay.

The second delay locked loop section 70 includes a second delay section 71, a phase comparing circuit 22, a delay control circuit 23 and a phase interpolating circuit 45-3. The second delay section 71 has a delay circuit 41-14 in which a delay amount is controlled, a differential signal/single signal converting circuit 42-13 and a single signal/differential signal converting circuit 43-2, in which a delay amount is controlled. A signal indicating a 0-phase is outputted from the first delay locked loop section 60, is supplied into the single signal/differential signal converting circuit 43-2 in the second delay section 71, and is converted into a delayed differential signal. An output signal from the single signal/differential signal converting circuit 43-2 is supplied to the delay circuit 41-14 and the differential signal/single signal converting circuit 42-13. A delay amount of the delay circuit 41-14 is controlled in response to the delay control signal ACTL1 in the first delay locked loop section 60. The differential signal/single signal converting circuit 42-13 converts a signal outputted from the single signal/differential signal converting circuit 43-2 into a single end signal, and outputs to the phase interpolating circuit 45-3. The phase interpolating circuit 45-3 is set in response to a phase interpolating control signal of 0 to output the 0-phase signal. The phase interpolating circuit 45-3 serves as a fixed delay circuit for giving only a fixed delay amount inherent to the circuit. The phase interpolating circuit 45-3 outputs a signal delayed by the fixed delay to the phase comparing circuit 22.

The phase comparing circuit 22 receives a signal indicating the phase delay of 60 degrees and outputted from the first delay locked loop section 60 and a signal outputted from the phase interpolating circuit 45-3. The phase comparing circuit 22 compares the phases of the two input signals with each other, and outputs a comparison result to the delay control circuit 23. The delay control circuit 23 includes a charge pump, a filter and a voltage/current converting circuit. The delay control circuit 23 generates the delay control signal ACTL2 and controls the phases of the two input signals to the phase comparing circuit 22 so as to match with each other. The produced delay control signal ACTL2 is supplied into the single signal/differential signal converting circuit 43-2, and controls a delay amount of the single signal/differential signal converting circuit 43-2. Through this feedback control, the second delay section 71 can have a delay difference between the two signals correctly outputted from the first delay locked loop section 60, that is, a delay amount corresponding to the phase difference between the 0-phase signal and the signal having the set phase. The delay control signal ACTL2 corresponding to the delay amount is supplied into the input signal delay section 80.

The input signal delay section 80 is provided with a third delay section 81 and a phase interpolating circuit 45-4. The third delay section 81 includes the single signal/differential signal converting circuit 43-3, delay circuits 41-15 to 41-17 and differential signal/single signal converting circuits 42-14 to 42-16. The third delay section 81 is configured to extend the second delay section 71. Specifically, the delay amount of the single signal/differential signal converting circuit 43-3 is controlled in response to the delay control signal ACTL2. The delay circuits 41-15 to 41-17, which receive an output signal from the single signal/differential signal converting circuit 43-3, are cascade-connected, and their delay amounts are controlled in response to the delay control signal ACTL1. In this manner, the delay amount of each of the delay circuits 41-15 to 41-17 is equal to that of each of the delay circuits 41-1 to 41-12 in the first delay section 61. Output signals from the single signal/differential signal converting circuit 43-3 and the delay circuits 41-15 and 41-16 are supplied into the phase interpolating circuit 45-4 through the differential signal/single signal converting circuits 42-14 to 42-16. In other words, if the 0-phase is set in the phase interpolating circuit 45-4, the input signal IN receives the same delay amount as produced in the second delay locked loop section 70 and is output as the output signal OUT. As a consequence, the input signal delay section 80 outputs the output signal OUT obtained by delaying the input signal IN by the delay amount as a summation of a delay amount by the input signal delay section 80 and a delay amount set in the first delay locked loop section 60.

The delay produced in the delay locked loop circuit in the third embodiment will be described below. It is assumed that the output from the single signal/differential signal converting circuit 43-1 is set to the phase of 0, and that the delay of each of the circuits is "D(circuit symbol)". That is to say, the delay of the delay circuit 41 is D(DCEL), which is 30 degrees, the delay of the differential signal/single signal converting circuit 42 is D(D2S), the delay of the single signal/differential signal converting circuit 43 is D(S2D), the delay of the phase interpolating circuit 45 is D(IP), and the delay set in the phase interpolating circuit 45 in response to a control signal OFS is expressed by $\alpha$.

The delay at an output of the delay circuit 41-1 is D(DCEL) of 30 degrees, and the delay at an output of the delay circuit 41-2 is 2D(DCEL) of 60 degrees. Since the output signal from the delay circuit 41-2 is supplied into the phase comparing circuit 22 through the differential signal/single signal converting circuit 42-3, a delay at an input of the phase comparing circuit 22 is 2D(DCEL)+D(D2S). Since another input signal of the phase comparing circuit 22 is supplied through the differential signal/single signal converting circuit 42-0, the single signal/differential signal converting circuit 43-2, in which the delay amount is controlled, the differential signal/single signal converting circuit 42-13 and the phase interpolating circuit 45-3, the delay amount is D(D2S)+D(S2D')+D(D2S)+D(IP) Here, the delay amount of the single signal/differential signal converting circuit 43-2 is controlled in response to the delay control signal ACTL2, so that the delay amount is expressed by D(S2D'). Since both phases are equal to each other in the phase comparing circuit 22, an equation below can be established:

$$2D(DCEL)=D(D2S)+D(S2D')+D(IP) \quad (2)$$

In the input signal delay section 80, the delay amount is controlled in response to the same control signal ACTL2 as in the single signal/differential signal converting circuit 43-2, so that the delay amount in the single signal/differential signal converting circuit 43-3 is D(S2D'). The input signal IN is delayed by the third delay section 81, and is supplied to the phase interpolating circuit 45-4. A route contains the single signal/differential signal converting circuit 43-3 and the differential signal/single signal converting circuit 42-14, the single signal/differential signal converting circuit 43-3, the delay circuit 41-15 and the differential signal/single signal converting circuit 42-15, or the single signal/differential signal converting circuit 43-3, the delay circuits 41-15 and 41-16 and the differential signal/single signal converting circuit 42-16. Thus, the respective delays supplied into the phase interpolating circuit 45-4 are as follows:

D(S2D')+D(D2S)

D(S2D')+D(DCEL)+D(D2S)

D(S2D')+2D(DCEL)+D(D2S)

Within this range of the delay, the phase is interpolated, and the output signal OUT is outputted. As a result, the delay amount is expressed, as D(S2D')+D(D2S)+D(IP)+$\alpha$.

The delay amount 2D(DCEL) +$\alpha$ is obtained by substituting this expression into the equation (2) as obtained above. This is a delay obtained by adding the delay amount 2D(DCEL) of 60 degrees set in the first delay locked loop section 60 to the delay amount $\alpha$ set in the input signal delay section 80. Thus, the delay locked loop circuit in the present embodiment can produce a delay amount matching with a desired delay.

Here, although the delay circuits 41 included in the third delay section 81 have a 3-stage configuration, the number of stages may depend upon a delay amount to be set. In addition, although the output signal from the delay circuits 41-2 on the second stage in the first delay section 61 is supplied to the second delay locked loop section 70, a stage, from which an output is taken out, may be determined according to the delay amount to be set.

Additionally, although the delay amount is produced from the differential signal, the delay amount may be produced from the single end signal in the same manner. Otherwise, when a plurality of input signals IN are delayed, the delay locked loop circuit may be provided with a plurality of input signal delay sections 80, for outputting a plurality of output signals OUT having different delays to be set, respectively.

In this manner, a fixed delay circuit, namely, is, a phase interpolating circuit (IP), in which the 0-phase output is set, may be provided in a second delay locked loop circuit. Thus, a precision of the delay amount can be improved.

Figure 3:
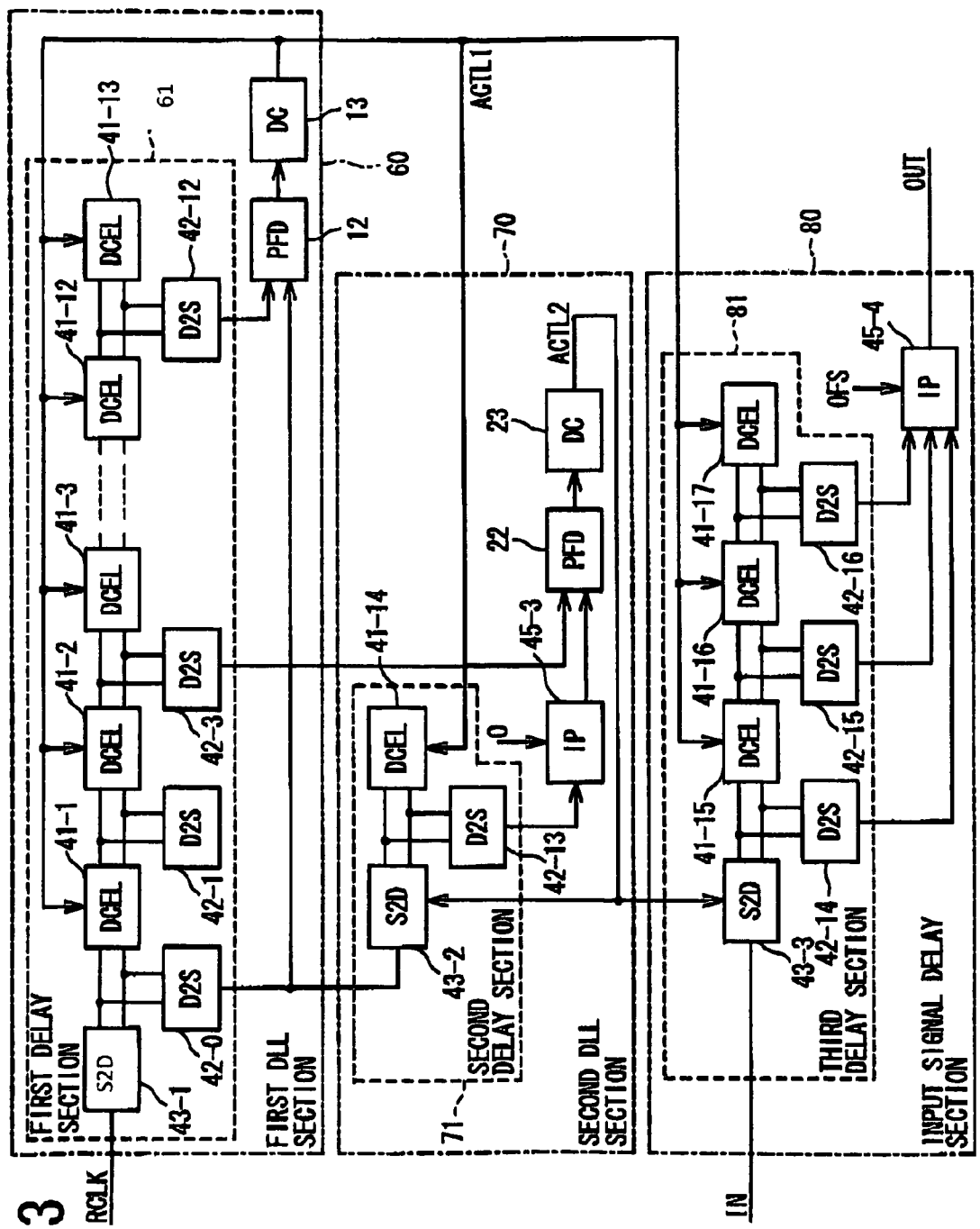
FIG. 3 is a block diagram showing the configuration of the delay locked loop circuit according to a third embodiment of the present invention.

It should be noted that, although the phase interpolating circuits illustrated in FIGS. 1 and 3 are of a single end signal type, a phase interpolating circuit of a differential signal type may be used. In such a case, a differential signal/single signal converting circuit may be disposed on a stage rearward of the phase interpolating circuit, and thus, a signal may be converted into the single end signal after phase interpolation.

What is claimed is:

1. A delay locked loop (DLL) circuit, comprising:
a first DLL section configured to receive a reference clock signal, to delay said reference clock signal in response to a first control signal, and to output a phase delayed signal having a predetermined phase delay;
a second DLL section, coupled in series to the first DLL section with respect to the reference clock signal, configured to delay said reference clock signal in response to a second control signal, and to generate said second control signal based on said reference clock signal delayed in said second DLL section and said phase delayed signal; and
an input signal delay section configured to delay an input signal in response to said second control signal,
wherein said first DLL section comprises:
a first delay section configured to delay said reference clock signal over a plurality of delay stages in response to said first control signal; and
a first control circuit configured to generate said first control signal from the reference clock signal and said reference clock signal delayed over said plurality of delay stages,
wherein said first delay section outputs the delayed reference clock signals from some of said plurality of delay stages, and
wherein said first DLL section further comprises:
a first fixed delay circuit having a first fixed delay amount and configured to generate said phase delayed signal from some delayed reference clock signals.

2. The DLL circuit according to claim 1, wherein said reference clock signal is a single reference clock signal, and
said first delay section generates a differential clock signal from said single reference clock signal and delays said differential clock signal over said plurality of delay stages in response to said first control signal.

3. The DLL circuit according to claim 1, wherein said reference clock signal is a single reference clock signal, and
a delay amount of each of said plurality of delay stages is set based on said first control signal in a digital form.

4. The DLL circuit according to claim 1, wherein said second DLL section comprises:
a second fixed delay circuit having a second fixed delay amount which is same as said first fixed delay amount and configured to delay said reference clock signal by said second fixed delay amount;
a second delay section configured to delay said reference clock signal delayed by said second fixed delay amount by said second fixed delay circuit, in response to said second control signal; and
a second control circuit configured to generate said second control signal from said reference clock signal delayed by said second delay section and said phase delayed signal.

5. The DLL circuit according to claim 4, wherein said reference clock signal is a single reference clock signal, and
said second delay section generates a differential clock signal from said single reference clock signal and delays said differential clock signal by at least one delay stage in response to said second control signal.

6. The DLL circuit according to claim 4, wherein said reference clock signal is a single reference clock signal, and
a delay amount of said at least one delay stage is set based on said second control signal in a digital form.

7. The DLL circuit according to claim 1, wherein said input signal delay section comprises:
a third delay section configured to delay an input signal in response to said second control signal.

8. The DLL circuit according to claim 7, wherein said input signal is a single input signal, and
said third delay section generates a differential input signal from said single input signal, delays said differential input signal by at least one delay stage in response to said second control signal, and generates a delayed single input signal from the delayed differential input signal.

9. The DLL circuit according to claim 7, wherein said input signal is a single input signal, and
said third delay section generates a differential input signal from said single input signal.

10. A delay locked loop (DLL) circuit, comprising:
a first DLL section configured to receive a reference clock signal, to delay said reference clock signal in response to a first control signal, and to output a phase delayed signal having a predetermined phase delay;
a second DLL section, coupled in series to the first DLL section with respect to the reference clock signal, configured to delay said reference clock signal in response to a second control signal, and to generate said second control signal based on said reference clock signal delayed in said second DLL section and said phase delayed signal; and
an input signal delay section configured to delay an input signal in response to said second control signal,
wherein said first DLL section comprises;
a first delay section configured to delay said reference clock signal over a plurality of delay stages in response to said first control signal; and
a first control circuit configured to generate said first control signal from the reference clock signal and said reference clock signal delayed over said plurality of delay stages,
wherein said first delay section outputs the delayed reference clock signal from one of said plurality of delay stages as said phase delayed signal, and
wherein said second DLL section comprises:
a second delay section configured to delay said reference clock signal in response to said first and second control signals;
a third fixed delay circuit having a third fixed delay amount which is predetermined and configured to delay said reference clock signal delayed by said second delay section by said third fixed delay amount; and
a second control circuit configured to generate said second control signal from said reference clock signal delayed by said second delay section and said phase delayed signal.

11. The DLL circuit according to claim 10, wherein said reference clock signal is a single reference clock signal, and
said second delay section generates a differential clock signal from said single reference clock signal and delays said differential clock signal by at least one delay stage in response to said first control signal.

12. The DLL circuit according to claim 10, wherein said reference clock signal is a single reference clock signal, and
a delay amount of said at least one delay stage is set based on said second control signal in a digital form.

13. The DLL circuit according to claim 10, wherein said input signal delay section comprises:
a third delay section configured to delay an input signal over a plurality of delay stages in response to said first and second control signal, and to output delayed input signals from some of said plurality of delay stages; and a fourth fixed delay circuit having a fourth fixed delay amount which is predetermined and configured to generate an output signal from said delayed input signals.

14. The DLL circuit according to claim 13, wherein said plurality of delay stages have different delay amounts.

15. A delay locked loop (DLL) circuit, comprising:

a first DLL section configured to receive a reference clock signal, to delay said reference clock signal in response to a first control signal, and to output a phase delayed signal having a predetermined phase delay;

a second DLL section, coupled in series to the first DLL section with respect to the reference clock signal, configured to delay said reference clock signal in response to a second control signal, and to generate said second control signal based on said reference clock signal delayed in said second DLL section and said phase delayed signal; and an input signal delay section configured to delay an input signal in response to said second control signal, wherein said second DLL section comprises a delay section configured to delay said reference clock signal in response to said first and second control signals.

16. A delay locked loop (DLL) circuit, comprising:

a first DLL section configured to receive a reference clock signal, to delay said reference clock signal in response to a first control signal generated from said first DLL section, and to output a phase delayed signal;

a second DLL section configured to delay said reference clock signal in response to a second control signal, and to generate said second control signal based on said reference clock signal delayed in said second DLL section and said phase delayed signal; and an input signal delay section configured to delay an input signal in response to said second control signal, wherein said second DLL section comprises a delay section configured to delay said reference clock signal in response to said first and second control signals.

* * * * *